(12) United States Patent
Howland

(10) Patent No.: US 11,415,553 B2
(45) Date of Patent: Aug. 16, 2022

(54) MOBILE AUTOMATED NON-DESTRUCTIVE INSPECTION SYSTEM

(71) Applicant: The United States of America, as represented by the Secretary of the Navy, Crane, IN (US)

(72) Inventor: Glenn Earle Howland, Acton, ME (US)

(73) Assignee: The United States of America, as represented by the Secretary of the Navy, Washington, DC (US)

( * ) Notice: Subject to any disclaimer, the term of this patent is extended or adjusted under 35 U.S.C. 154(b) by 105 days.

(21) Appl. No.: 16/936,959

(22) Filed: Jul. 23, 2020

(65) Prior Publication Data

US 2021/0025852 A1    Jan. 28, 2021

Related U.S. Application Data

(60) Provisional application No. 62/877,543, filed on Jul. 23, 2019.

(51) Int. Cl.
| | |
|---|---|
| *G01N 17/04* | (2006.01) |
| *B25J 13/08* | (2006.01) |
| *G06F 30/13* | (2020.01) |
| *G01N 29/28* | (2006.01) |
| *G01N 29/04* | (2006.01) |

(52) U.S. Cl.
CPC ............ *G01N 29/04* (2013.01); *B25J 13/087* (2013.01); *G01N 17/04* (2013.01); *G01N 29/28* (2013.01); *G06F 30/13* (2020.01); *G01N 2291/2636* (2013.01)

(58) Field of Classification Search
CPC ........ G06F 30/13; B25J 13/087; G01N 29/28; G01N 29/265; G01N 29/225; G01N 17/04; G01N 29/0654; G01N 29/043; G01N 2291/2636; G01N 2291/0289
USPC .......................................................... 73/623
See application file for complete search history.

(56) References Cited

U.S. PATENT DOCUMENTS

| | | | | |
|---|---|---|---|---|
| 5,681,131 | A * | 10/1997 | Goldenberg | F16L 55/26 |
| | | | | 242/118.1 |
| 6,345,508 | B1 * | 2/2002 | Bodhaine | F28D 7/024 |
| | | | | 62/50.3 |
| 6,887,014 | B2 * | 5/2005 | Holland | B08B 9/049 |
| | | | | 104/138.2 |
| 6,913,083 | B2 * | 7/2005 | Smith | E21B 47/135 |
| | | | | 166/336 |
| 9,145,791 | B2 * | 9/2015 | Yoon | F01D 21/003 |
| 9,410,659 | B2 * | 8/2016 | Troy | G05D 1/0276 |

(Continued)

FOREIGN PATENT DOCUMENTS

| | | | | |
|---|---|---|---|---|
| CN | 102501793 | * | 6/2012 | |
| EP | 20090010697 | * | 11/2018 | ............ B25J 5/007 |

(Continued)

*Primary Examiner* — Jacques M Saint Surin
(74) *Attorney, Agent, or Firm* — Naval Surface Warfare Center, Crane Division; Eric VanWiltenburg

(57) ABSTRACT

A mobile automated pipe or shaft non-destructive inspection system with rotational inspection sensor assembly for 360 degree imaging or sensing and generation of three dimensional models or sensing imaging or depictions of the pipe or shaft, preservative removal/application system, mobile platform mounting, and control system as well as related methods.

20 Claims, 5 Drawing Sheets

(56) References Cited

U.S. PATENT DOCUMENTS

| | | | |
|---|---|---|---|
| 10,730,185 B2* | 8/2020 | Walters | F01D 25/28 |
| 2007/0146480 A1* | 6/2007 | Judge | G21C 17/013 |
| | | | 348/83 |
| 2014/0311245 A1* | 10/2014 | Horoshenkov | G01N 29/4427 |
| | | | 73/592 |

FOREIGN PATENT DOCUMENTS

| | | | | |
|---|---|---|---|---|
| KR | 20100095671 | * | 1/2010 | B25J 19/02 |
| WO | WO-2006078873 A2 | * | 7/2006 | H04N 7/185 |

* cited by examiner

MOBILE AUTOMATED NON-DESTRUCTIVE INSPECTION SYSTEM

CROSS-REFERENCE TO RELATED APPLICATIONS

This application claims priority to U.S. Provisional Application Ser. No. 62/877,543 filed on Jul. 23, 2019 the disclosure of which is expressly incorporated herein by reference.

STATEMENT REGARDING FEDERALLY SPONSORED RESEARCH OR DEVELOPMENT

The invention described herein was made in the performance of official duties by employees of the Department of the Navy and may be manufactured, used and licensed by or for the United States Government for any governmental purpose without payment of any royalties thereon. This invention (Navy Case 200,604) is assigned to the United States Government and is available for licensing for commercial purposes. Licensing and technical inquiries may be directed to the Technology Transfer Office, Naval Surface Warfare Center Crane, email: Cran_CTO@navy.mil.

BACKGROUND AND SUMMARY OF THE INVENTION

The present invention relates to non-destructive inspection systems in pipe or shaft systems via automated systems. In particular embodiments of this invention have a moveable remote controlled platform which enables use of scanning systems to perform inspections of enclosed areas such as pipes or shafts. Various types of scanning equipment can be used to include non-destructive inspection systems. Embodiments can also include systems which remove or apply coatings from an internal surface of the enclosed areas such as preservatives which have been applied to surfaces which might inhibit scanning or inspection activities.

A need exists for improved inspections systems including systems used for ship drive shaft inspections. Drive shafts for ships can be quite lengthy and have a relatively smaller diameter which makes human access difficult or impossible. Propulsion shaft failure can have significant impacts on a ship to include flooding and loss of propulsion. Current systems and approaches require removal of the shaft, preparation and finding personnel who are small enough to fit into confined spaces of a shaft interior. Moreover, an external inspection approach is used but there are numerous false sensor readings for a variety of reasons such as wrapping or external coatings on shafts which impede use of current sensor technology. When a potential flaw is found, then a person has to be sent down the shaft which creates additional difficulties in locating the exact spot where a potential flaw was discovered during the external inspections. There are also difficulties associated with preservatives or coatings which are applied to various shafts or pipes which may have to be removed. Another problem is the need to have the shafts removed in the first place given an external inspection is currently called for followed by an internal inspection if questions arise from such an external inspection. Thus, improvements to the current state of the art for at least ship inspections are desired to include an ability to avoid costly and time consuming preparation of shafts or pipes for inspection, use of external inspections which can result in a false defect detection, and a need to address removal and reapplication of coatings within a shaft or pipe before and after an inspection is completed.

Various embodiments can utilize a robot with a three points of contact with the internal pipe walls. This three point configuration provides a stable platform for movement within a pipe or shaft. This configuration can also center the robot body in the bore. From the leading edge of the body, an arm will rotate on a shoulder about the centerline of the body. An embodiment can utilize a tension arm to maintain the instrument at the prescribed position relative to the internal surface. Some NDI testing requires the application of material to the test surface. This material will require the development of a remote metering system. This metering system can be mounted on an exemplary platform or robot. Power for the metering system can be supplied by the umbilical. The material is deposited ahead of the probe. This will require to probe to move in one direction. The scan pattern can be cylindrical with the robot indexing horizontally (either direction). The data gained can be manipulated to form a three dimensional (3D) scan of a particular section of the pipe wall or the entire pipe.

This will allow the operator to manipulate the instrument efficiently and analyze any point of interest within shaft. The probe arms can be deployed using linear actuators.

Embodiments of the invention can include a mobile automated pipe or shaft non-destructive inspection system with rotational inspection sensor assembly for 360 degree imaging or sensing and generation of three dimensional models or sensing imaging or depictions of the pipe or shaft, preservative removal/application system, mobile platform mounting, and control system as well as related methods. The NDI processes targeted for this robot are Ultrasonic Testing (UT), visual inspection and electronic corrosion mapping.

In particular, at least some embodiments can include a shaft inspection robotic device and probe array that can be mounted on a commercially available robotic chassis modified with a mechanical arm that moves about the body in a circular motion. The control module will convert all motion controls from the Operator Base Station X to control robot movement and operations. A cable interface at the rear of the robot will divert all power/signals/strength from the Umbilical to the appropriate robot modules. The Probe Arm allows the inspection of a section of pipe wall with Ultrasonic Testing (UT), Corrosion Depth sensing and slots for future instruments. The exemplary arm can be deployed by an actuator and spring system that maintains the UT probe in contact with the pipe wall. The arm has a deployable standoff wheel for future instrument requirements. The wheel can be part of a kit containing multiple wheel diameters. The robot has visual capabilities with a rotating camera mounted in the leading edge of the body. The camera will have sufficient zoom capability to perform visual inspections. There's a backup power supply incorporated in the robot chassis for emergency extraction. An injection system, utilizing a metering pump and delivery system, can be incorporated into the body to deliver glycerin for UT inspections. Electric motors provide propulsion through three caterpillar type drives. An onboard navigation system that allows accurate placement of the Probe Array at the site of interest. Incorporating the drive system and arm motion will allow for scanning the pipe either in line with the pipe length or with the internal bore.

Additional features and advantages of the present invention will become apparent to those skilled in the art upon consideration of the following detailed description of the illustrative embodiment exemplifying the best mode of carrying out the invention as presently perceived.

BRIEF DESCRIPTION OF THE DRAWINGS

The detailed description of the drawings particularly refers to the accompanying figures in which.

DETAILED DESCRIPTION OF THE DRAWINGS

The embodiments of the invention described herein are not intended to be exhaustive or to limit the invention to precise forms disclosed. Rather, the embodiments selected for description have been chosen to enable one skilled in the art to practice the invention.

An onboard navigation system will allow the operator to accurately place the probes at an area of interest. The software system used by the Command Module will map the data captured by the probes relative to the probe position. This information will be used as Objective Quality Evidence in reporting the condition of a propulsion shaft. The robot's movement in line with the bore and the arm's circular movement are tracked for accurate probe position at all times via the onboard navigation system. The onboard navigation system may use lasers and targets for accurate placement in line with the shaft. The exemplary arm can be calibrated each time upon robot insertion using a target installed by the operator. Similar to the exemplary process identified above, an electronic corrosion inspection can be performed by manipulating an exemplary sensor or probe arm to survey a target area. The robot control system can be initialized or indexed to map a 3D image of an area, which can include detected corrosion. An exemplary scan pattern can be similar to a UT process in that an operator could target an area of the pipe or a complete cylindrical scan. A robot embodiment can index horizontally to capture the data to construct a 3D image of a given shaft, pipe, or target area.

Figure 1:
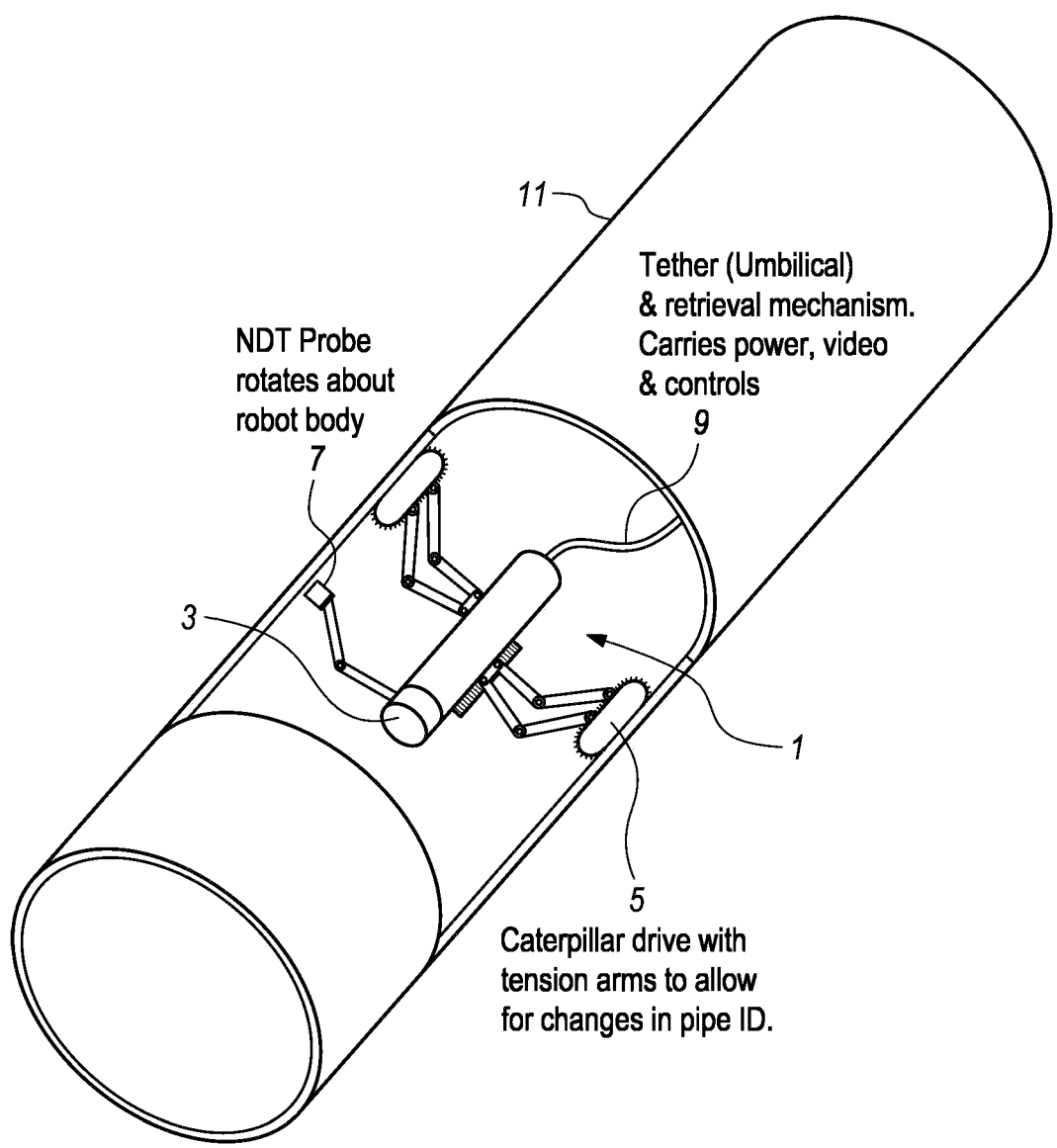
FIG. 1 shows a simplified perspective view of an embodiment of the invention is shown within a cut-away shaft that an exemplary system is shown within.

Referring to FIG. 1, a simplified perspective view of an embodiment of the invention is shown within a cut-away shaft 11 that an exemplary system 1 is shown within. A NDI probe system with probe arm 7 is shown in a deployed view rotating and scanning the shaft system. A simplified drive system 5 is shown that includes multiple caterpillar drives with adjustable suspension systems which center a platform within the shaft. An exemplary tether 9 is shown which provides power, video, control, data signal bus or signal transfer to and from an operator or base station (not shown).

Figure 2:
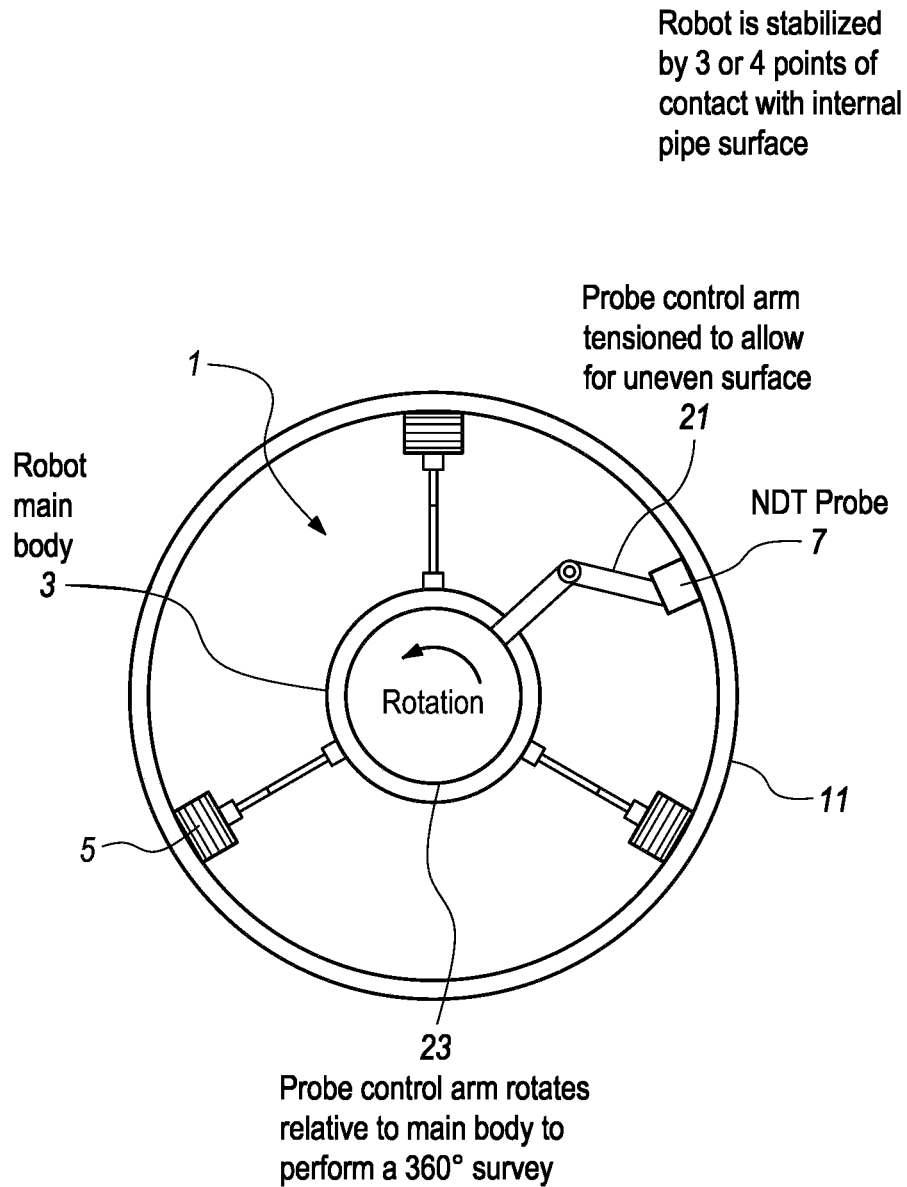
FIG. 2 shows a cross sectional view of a shaft or pipe with an exemplary embodiment of the invention.

Referring to FIG. 2, a cross sectional view of a shaft or pipe with an exemplary embodiment of the invention is shown. The exemplary robot or platform 1 can be stabilized within the shaft or pipe 11 with armatures or a set of suspension elements that mount drive systems 5 which can be caterpillar or tread drive systems. The exemplary suspension system can include elements which adjusts a distance from shaft wall to a centerline of the robot platform or rotational axis of a probe or sensor system arm 21.

Figure 3:
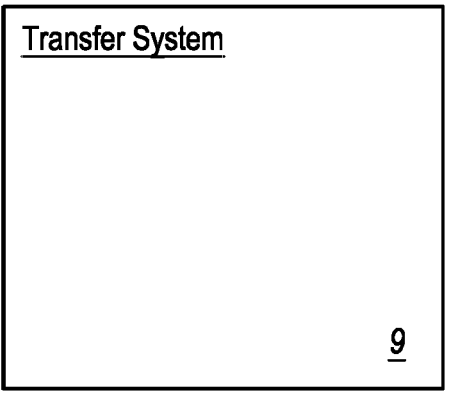
FIG. 3 shows an exemplary simplified functional block diagram of various elements of one embodiment of the invention.
Figure 3:
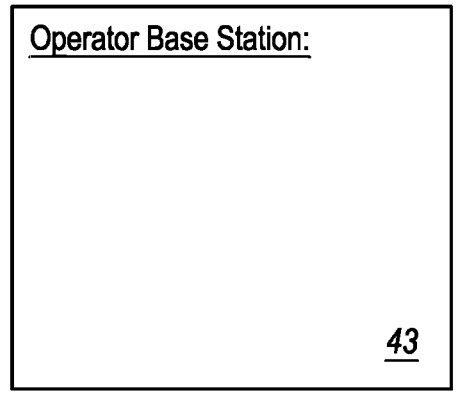
Figure 3:
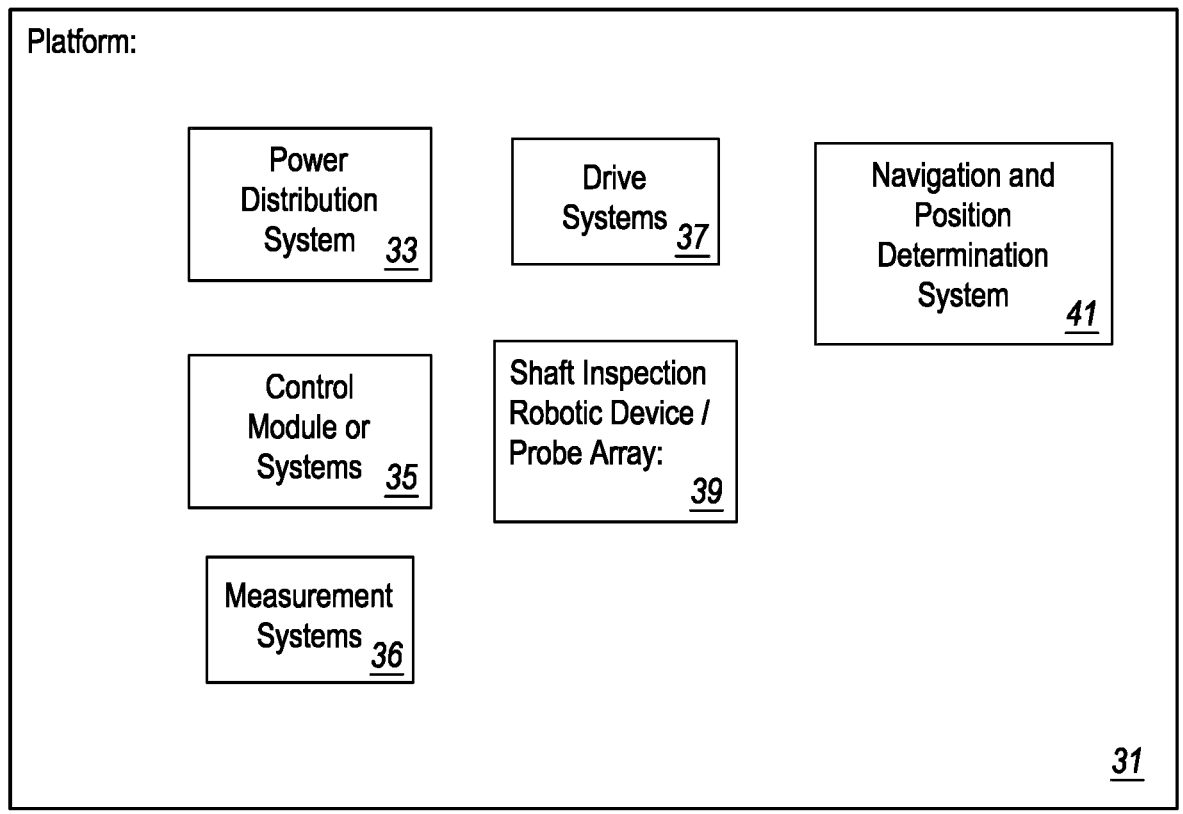

Referring to FIG. 3, a functional block diagram of one embodiment of the invention is shown. Generally, embodiments of the invention can employ a modified pipe inspection robot as a base vehicle which mounts various aspects or design elements of this disclosure. The exemplary robot can be modified to fit a range of bores. Embodiments of the robot can further include measuring systems 36 that sense drive and suspension system position or wall pressure on drive or suspension elements and adjust automatically suspension elements to adjust for shaft or pipe bore diameter differences. An exemplary robot or platform can successfully traverse smooth slippery surfaces and maintain its body in the center of the bore. An exemplary robot and signal transfer system 9 (e.g., umbilical cable) can be designed to be able to penetrate at least 100 feet inside a shaft or pipe and operate at least four feet under water or in a fluid. The exemplary robot can be designed to carry an onboard back-up power supply for use during an emergency extraction or operate during power loss or decoupled umbilical cable conditions. For example, a system can be designed with onboard control logic and systems 35 to automatically traverse itself out a pipe or shaft to a point of origin in a variety of fault scenarios such as loss of control signal, external power supply failure, onboard faults, etc. An umbilical or cable interface at the rear of the robot will divert all power/signals and strength from the umbilical to the appropriate robot modules. A control module will be incorporated in the robot body. The control module can be designed to convert all motion control signals from an operator station or command module 43 to operate various robot drive motors. In one embodiment, a triple caterpillar drive system mounted on adjustable struts or suspension elements extending away from the robot's body or platform can be incorporated to maximize traction and maintain the robot body in relation to an environment such as a center of a shaft or pipe bore. The drive system's suspension elements can be designed to expand to fit the bore via linear actuators. A means to remotely release the actuators can also be provided to allow for an emergency extraction in the event of a robot failure via e.g., a tow cable attached to a portion of the robot or platform (e.g. to drag the robot or platform system out). A backup power supply can be included on the robot chassis to assist in an emergency extraction.

Generally, an exemplary probe arm can be mounted to the platform that is can rotate 360 degrees about a center axis or the body of the robot which can be used to deploy a probe array 39. Exemplary probe arrays or sensors 39 can include ultrasonic test (UT) and electronic corrosion depth probes. Visual inspection instruments can also be mounted on the robot body or platform with zoom capabilities. An exemplary system can have a data transfer capability to send sensor, position, control, etc. data back to the operator base station for analysis and capture or storage via the umbilical cable (or through other means such as optical communication laser). The exemplary probe arm 41 can be designed to maintain a desired position or even pressure contact of by one or more sensors or probes in contact with an inspection or test surface and allow for any variations in the test or inspection surface. A standoff wheel can also be added to the arm to facilitate maintaining a desired probe or sensor distance from the test or inspection surface as needed. An optional kit containing various standoff wheel diameters can be included in the exemplary robot system for use by operators. An coating removal and/or injection system can also be mounted on the robot chassis or platform. The injection system can apply a desired coating to a desired surface such as delivering Glycerin to the test or inspection surface in advance of the UT probe movement.

An transfer system 9 can be provided that includes a compact umbilical that can be constructed to incorporate some or all of command signals, data transmissions, nitrogen supply for onboard cameras, robot power supply and a strength member. The strength member can be integral to the cable and be necessary in the event of an emergency extraction. Exemplary cables can be sized for maximum performance and reduced weight. The exemplary cable and cable ends may be watertight in the event that it is exposed to liquids.

An exemplary operator control system or command module can include a laptop computer with a high definition display. The exemplary display will be utilized for evaluating the video signal from onboard cameras. A hard drive with sufficient space to process and capture all information/controls required by a single operation. Various exemplary robot commands can be generated by a user control such as, e.g., a track-pad or joystick. The probe or sensor arm can be controlled by command or user input functions. The operator control system or command module can also include control logic that will prevent inadvertent damage to the probe or sensor arm. An onboard processor can be included that has sufficient to process all data via installed software for on-site analysis. Software can be incorporated into the operator control system or command module which enables analysis of sensor data and display of images or data associated with a test or inspection surface or a structure or material underneath the test or inspection surface such as a shaft or pipe as well as welds in the shaft or pipe.

Figure 4:
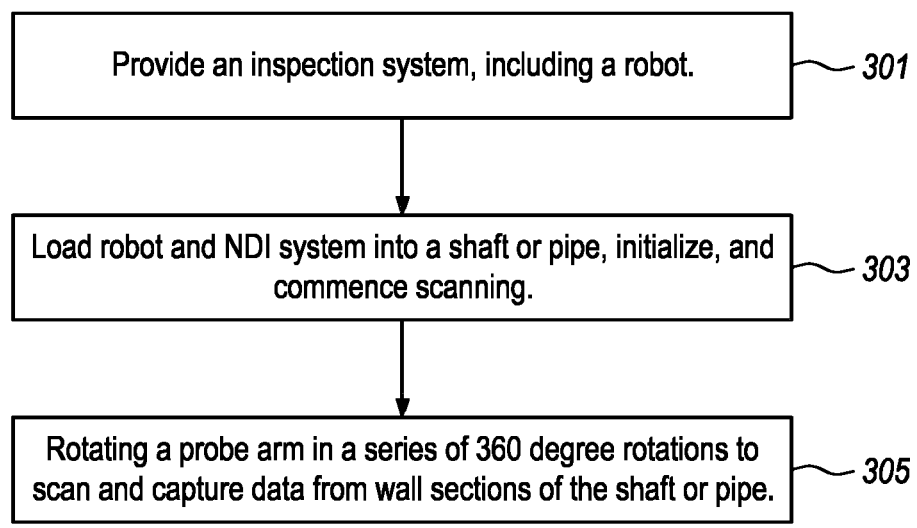
FIG. 4 shows an exemplary method of operation of a system in accordance with one embodiment of the invention.

FIG. 4 shows an exemplary method in accordance with one embodiment of the invention. At Step 301: Provide a system such as described herein. At Step 303: Load robot and NDI system into a shaft or pipe, initialize, and commence scanning. At Step 305: Rotating a probe arm in a series of 360 degree rotations to scan and capture data from wall sections of the shaft or pipe.

Figure 5:
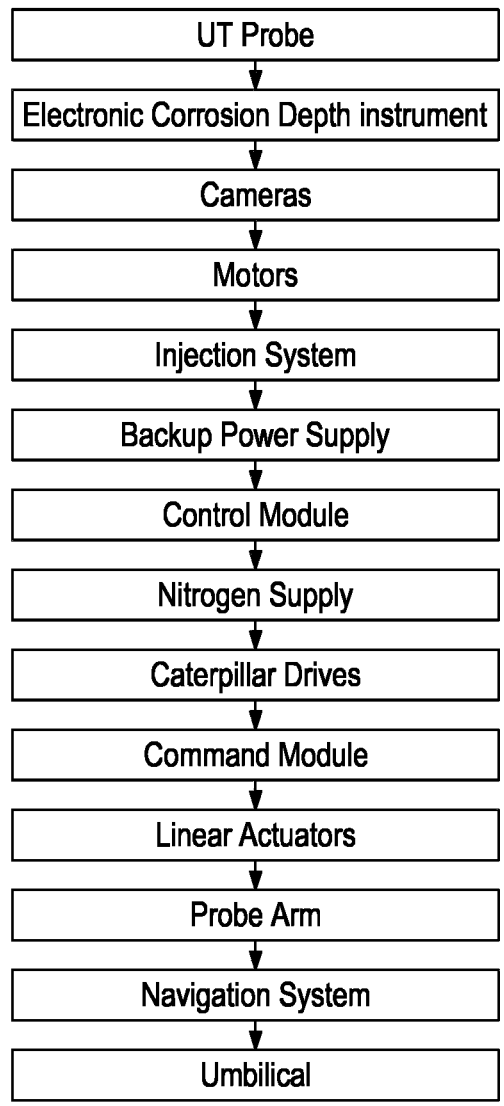
FIG. 5 shows a summary of exemplary parts or systems that can be used with an exemplary embodiment of the invention.

FIG. 5 shows a summary of exemplary functions/systems that can be used with an exemplary embodiment of this invention. UT Probe: produces a sonic signal and captures the return as data for analysis. Electronic Corrosion Depth instrument: accurately measures the depth of pitting caused by corrosion. Cameras: allow the operator a means of viewing the robot's movement and allows for detailed visual inspection of any area of interest. An integral zoom feature will allow a very detailed analysis of any corrosion. Motors: high efficiency drive motors that provide a motive force for the caterpillar drives. Injection System: provides a source of Glycerin to the test surface in advance of the UT probe. Backup Power Supply: maintains sufficient power onboard the robot for emergency functions in an event that an extraction may be required. Power can be used to release brakes, override linear actuators and provide motor power. Control Module: can direct all power and control signals delivered to the robot via the Umbilical to the appropriate module. The exemplary control module can also relay all data/video captured by the robot and probe array to the Command Module for analysis via the Umbilical. Nitrogen Supply: nitrogen can be supplied via the Umbilical to the robot for use in cleaning the camera lens. Caterpillar Drives: used for maximum traction with the shaft interior. Caterpillar Drives can provide smooth operation and a very stable system for accurate probe manipulation. Operator Control System or Command Module: a single control console for maximum flexibility and portability. The Command Module can have sufficient capacity to analyze all data on-site. It will provide a high definition monitor for accurate visual analysis. The operator control system or command module can also have sufficient capacity to store all data captured. Linear Actuators: utilized to manage the deployment of the Caterpillar Drives with the shaft walls. A linear actuator can be used for deploying the arm. Probe Arm: incorporates a shoulder on the robot body that allows the arm to rotate about an axis or a centerline (e.g. shaft centerline axis). The exemplary arm incorporates a linear actuator and elbow that allows the arm to be deployed or retracted as needed. An Injection System line can be integral to the arm along with all probe cables. Navigation System: capable of accurately tracking the robot and probe position within the shaft. It will be capable of continuous penetration distance verification using an installed target and laser system. An exemplary probe position can be calibrated during initial robot insertion in the shaft. This exemplary system can provide very accurate probe position data for use in mapping deficiencies. Umbilical: supplies power and command signals to the robot from the Operator control system or Command Module. It provides means of conveying data from all probes and visual evidence to the Command Module for analysis. An exemplary umbilical system can provide nitrogen gas to the camera for cleaning. It also serves as a strength member to assist in the event of an emergency extraction. Various components can be incorporated into a compact cable assembly with watertight connectors.

Although the invention has been described in detail with reference to certain preferred embodiments, variations and modifications exist within the spirit and scope of the invention as described and defined in the following claims.

The invention claimed is:

1. A mobile automated pipe or shaft non-destructive inspection system comprising:
an operation and control station including a power system;
a nitrogen source;
an umbilical cable comprising a plurality of control, data, nitrogen conduit, and power lines coupled with the operation and control station and nitrogen source; and
a remotely controlled mobile non-destructive inspection platform connected to the umbilical cable comprising a control system that communicates with systems on the platform and the operation and control station through the umbilical cable, a drive system, a position determination system, a navigation system, a plurality of sensors, a rotational sensor arm mounting at least some of the plurality of sensors, and a coating removal or application system that removes or applies at least one coating to a surface;
wherein the drive system comprises a plurality of adjustable drive components and suspension systems that adjustably and laterally positions the remotely controlled mobile non-destructive inspection platform within an enclosing structure; and
wherein the plurality of sensors comprises a rotational inspection sensor assembly including the rotational sensor arm for 360 degree imaging or sensing and generation of three dimensional models or sensing imaging or depictions of enclosing structure walls, the rotational sensor arm configured to rotate a full 360 degrees of rotation relative to a main body of the remotely controlled mobile non-destructive inspection platform.

2. An inspection system comprising:
a remotely controlled mobile non-destructive inspection platform comprising a control system, a drive system, a position determination system, a navigation system, a plurality of sensors, a rotational sensor arm mounting at least some of the plurality of sensors, and a coating removal or application system that removes or applies at least one coating to a surface;
wherein the drive system comprises a plurality of adjustable drive components and suspension systems that adjustably and laterally positions the remotely controlled mobile non-destructive inspection platform within an enclosing structure; and
wherein the plurality of sensors comprises a rotational inspection sensor assembly including the rotational sensor arm for 360 degree imaging or sensing and generation of three dimensional models or sensing imaging or depictions of enclosing structure walls, the rotational sensor arm configured to rotate a full 360 degrees of rotation relative to a main body of the remotely controlled mobile non-destructive inspection platform.

3. The system of claim 2, further comprising an operation and control station including a power system.

4. The system of claim 2, further comprising:
an umbilical cable coupled with the operation and control station, the umbilical cable comprising a plurality of control, data, and power lines and a nitrogen conduit;
wherein the remotely controlled mobile non-destructive inspection platform communicates with the operation and control station through the umbilical cable.

5. The system of claim 4, further comprising a nitrogen source, wherein the nitrogen source transfers nitrogen to the inspection platform through the nitrogen conduit.

6. The system of claim 5, further comprising a camera configured to transmit images via the umbilical cable.

7. The system of claim 6, wherein the nitrogen source is configured for use in cleaning a lens of the camera.

8. The system of claim 2, wherein the rotational sensor arm is further configured to rotate around an axis of rotation parallel to a direction of travel of the main body of the remotely controlled mobile non-destructive inspection platform.

9. The system of claim 2, wherein at least some of the plurality of sensors of the rotational sensor arm includes an ultrasonic testing (UT) probe configured to produce a sonic signal and capture a returned sonic signal.

10. The system of claim 9, wherein the remotely controlled mobile non-destructive inspection platform further comprises an injection system configured to provide glycerin to a test surface of the enclosing structure in advance of the UT probe.

11. The system of claim 2, wherein the rotational sensor arm includes a shoulder coupled to the main body that allows the rotational sensor arm the full 360 degrees of rotation relative to the main body.

12. The system of claim 2, wherein the rotational sensor arm includes a linear actuator and an elbow that allows the rotational sensor arm to be selectively deployed or retracted.

13. The system of claim 2, wherein the plurality of adjustable drive components and suspension systems comprises multiple caterpillar drives with adjustable suspension systems.

14. The system of claim 1, further comprising a camera configured to transmit images via the umbilical cable.

15. The system of claim 14, wherein the nitrogen source is configured for use in cleaning a lens of the camera.

16. The system of claim 1, wherein the rotational sensor arm is further configured to rotate around an axis of rotation parallel to a direction of travel of the main body of the remotely controlled mobile non-destructive inspection platform.

17. The system of claim 1, wherein at least some of the plurality of sensors of the rotational sensor arm includes an ultrasonic testing (UT) probe configured to produce a sonic signal and capture a returned sonic signal.

18. The system of claim 17, wherein the remotely controlled mobile non-destructive inspection platform further comprises an injection system configured to provide glycerin to a test surface of the enclosing structure in advance of the UT probe.

19. The system of claim 1, wherein the rotational sensor arm includes a shoulder coupled to the main body that allows the rotational sensor arm the full 360 degrees of rotation relative to the main body.

20. The system of claim 1, wherein the rotational sensor arm includes a linear actuator and an elbow that allows the rotational sensor arm to be selectively deployed or retracted.

* * * * *